(12) United States Patent
Mühlberger et al.

(10) Patent No.: US 8,466,789 B2
(45) Date of Patent: Jun. 18, 2013

(54) METHOD FOR THEFT RECOGNITION ON A PHOTOVOLTAIC UNIT AND INVERTER FOR A PHOTOVOLTAIC UNIT

(75) Inventors: Thomas Mühlberger, Marchtrenk (AT); Roland Prötsch, Roitham (AT)

(73) Assignee: Fronius International GmbH, Pettenbach (AT)

( * ) Notice: Subject to any disclaimer, the term of this patent is extended or adjusted under 35 U.S.C. 154(b) by 784 days.

(21) Appl. No.: 12/733,391

(22) PCT Filed: Aug. 26, 2008

(86) PCT No.: PCT/AT2008/000301
§ 371 (c)(1),
(2), (4) Date: Feb. 26, 2010

(87) PCT Pub. No.: WO2009/026602
PCT Pub. Date: Mar. 5, 2009

(65) Prior Publication Data
US 2010/0207764 A1    Aug. 19, 2010

(30) Foreign Application Priority Data

Aug. 29, 2007 (AT) .................................... 1350/2007

(51) Int. Cl.
G08B 13/14 (2006.01)
G08B 1/08 (2006.01)
H04Q 1/30 (2006.01)
H02N 6/00 (2006.01)

(52) U.S. Cl.
USPC ..................... 340/571; 340/568.1; 340/568.2; 340/531; 340/533; 136/243; 136/244

(58) Field of Classification Search
None
See application file for complete search history.

(56) References Cited

U.S. PATENT DOCUMENTS 4,121,201 A * 10/1978 Weathers ...................... 340/524
7,772,974 B2 * 8/2010 Ehrensvard et al. ....... 340/572.1
(Continued)

FOREIGN PATENT DOCUMENTS
DE     94 11 783       2/1995
DE     101 36 147      2/2003
(Continued)

OTHER PUBLICATIONS

European Search Report dated Sep. 26, 2012 in the corresponding European Patent Application 08782829.9 with an English translation of relevant parts.

(Continued)

*Primary Examiner* — Jennifer Mehmood
*Assistant Examiner* — Pameshanand Mahase
(74) *Attorney, Agent, or Firm* — Collard & Roe, P.C.

(57) ABSTRACT

The invention relates to a method for recognition of the theft of at least one solar module (5) on a photovoltaic unit with an inverter (1) an intermediate circuit (3), a DC-AC converter (4), at least one solar module (5) connected via connector lines (19) and a control device (8). A signal unit (19) which can be connected to the connector lines (9, 10), for generating and transmitting an electrical signal and a device for measuring and analyzing the signal received from the at least one solar module (5) are provided such that conclusions can be drawn about the theft of a solar module (5) from the received signal. According to the invention, reliable recognition of theft of a solar module (5) can be achieved by designing the signal unit (19) for generating varying electrical signals.

20 Claims, 4 Drawing Sheets

U.S. PATENT DOCUMENTS

2002/0063625 A1    5/2002  Takehara et al.
2004/0216777 A1*  11/2004  Pan .............................. 136/246

FOREIGN PATENT DOCUMENTS

| DE | 101 61 480     | 7/2003 |
| EP | 0584540        | 3/1994 |
| GB | 2 286 475      | 8/1995 |
| JP | 2000-164906    | 6/2000 |
| WO | WO 2007/048421 | 5/2007 |
| WO | WO 2008/043814 | 4/2008 |
| WO | WO 2008/046370 | 4/2008 |

OTHER PUBLICATIONS

Austrian Office Action dated May 30, 2008 with English translation of relevant parts.
International Search Report.

* cited by examiner

METHOD FOR THEFT RECOGNITION ON A PHOTOVOLTAIC UNIT AND INVERTER FOR A PHOTOVOLTAIC UNIT

CROSS REFERENCE TO RELATED APPLICATIONS

This application is the National Stage of PCT/AT2008/000301 filed on Aug. 26, 2008, which claims priority under 35 U.S.C. §119 of Austrian Application No. A 1350/2007 filed on Aug. 29, 2007. The international application under PCT article 21(2) was not published in English.

The invention relates to a method for recognition of the theft of at least one solar module on a photovoltaic unit, said solar modules being connected via connector lines to at least one inverter, with an electric signal being generated and applied to at least one of the connector lines of the solar modules, and the signal received by the at least one solar module being measured and analysed in order to assess a theft.

The invention also relates to an inverter with an intermediate circuit, a DC-AC converter, at least one solar module connected via connector lines, and a control device, providing a signal unit, which can be connected to the connector lines, for generating and transmitting an electric signal, and a device for measuring and analysing the signal received by the at least one solar module, so conclusions can be drawn about the theft of a solar module from the received signal.

Photovoltaic units are used to convert solar radiation energy to electric energy. For this purpose, solar modules, which produce a DC voltage, and inverters, which convert the DC voltage to an AC voltage, are required. The generated AC voltage can be fed to the public electricity grid or to directly connected consumers.

Photovoltaic units with a high performance and a correspondingly high number of solar modules are often mounted at outdoor sites. In this case, the components of the photovoltaic units might be subject to theft and/or removal by force, especially the expensive solar modules.

While security devices such as fencings, CCTV systems, motion sensors or the like are known, they often fail to give the desired results. Moreover, such measures require relatively great efforts to be installed, and animals, for instance, might cause malfunctions.

Other devices use mechanical security means such as locks, sensors or the like, which are fastened to the solar modules. A disadvantage of these solutions is that additional assembly procedures, such as applying additional cables, are required.

WO 2007/048421 A2, for example, discloses a circuit for a photovoltaic unit which makes it possible to detect malfunctions in the solar modules.

DE 101 61 480 A1 discloses a method and a device to monitor solar modules by monitoring characteristic values for sudden changes.

DE 94 11 783 U1 describes an anti-theft protection system for photovoltaic solar generators, wherein, in the event of the removal of a solar cell, the voltage increases considerably, so an alarm can be set off and the theft can be detected.

Finally, JP 2000-164906 A shows a device to detect the theft of solar modules on a photovoltaic unit, in which a test current is applied to the solar modules, so in case of a theft values below this test current are being detected.

The objective of the present invention is to provide a method as mentioned above and an inverter as mentioned above, which can be used to effectively protect the solar modules on a photovoltaic unit from theft.

Regarding the method, the objective of the invention will be achieved by transmitting in succession signals differing from each other in form and amplitude to the at least one solar module, and selecting as a reference signal for assessing a theft that signal which causes a useful received signal when the solar modules are present.

By the method according to the invention, a removal of a solar module can be detected effectively. The effort required is relatively low.

By using electric signals that vary in form and amplitude, an optimal electric signal for theft recognition can be selected for the respective type of the solar module.

Preferably, the generation of the electric signal takes place inside the inverter of the photovoltaic unit, so no additional components have to be mounted. Another advantage is that the theft recognition is not visible to a thief.

Advantageously the electric signal is automatically generated and applied if at least one inverter does not generate AC. Thus, the method for theft recognition is activated automatically at dusk and/or during the night, when the solar modules do not produce any voltage.

In order to detect the beginning dusk and/or the night, advantageously the voltage of the solar modules is monitored. Thereby, dawn can also be detected automatically and preferably the theft recognition can be switched off automatically.

According to another feature of the invention, the solar modules are provided to be disconnected from the at least one inverter by a switchover device when a defined voltage of the solar modules is measured. Thereby, it can be achieved that the solar modules are disconnected from the inverter or the inverters and connected to the device for theft recognition at night.

The electric signal is generated by a signal unit that is preferably integrated in the switchover device, said signal unit being activated by a control device of the inverter. Thereby, the switchover device is independent from the inverter and/or can be adjusted to the inverter and may be installed at a later time. The normal operation mode of the inverter is not influenced by the switchover device.

In order to activate the switchover device and the device for theft recognition, the control device of the inverter preferably transmits a starting signal to the switchover device.

Preferably, the connection of at least one connector line to the at least one inverter is interrupted by at least one switchover means and at least one of the connector lines is connected to the signal unit by at least one switchover means, when the switchover device is activated. The switching over makes it possible to form an electric circuit of its own for the theft recognition, so it can be operated independently from the actual function of the inverter. Also, the switching over disconnects the electronic parts of the at least one inverter from the electric signal for theft recognition and therefore protects them.

If the type of the solar modules is unknown, different electric signals can be sent to the at least one solar module in succession, and that electric signal which causes a useful received signal when the solar modules are present can be selected as the reference signal. Thereby, the optimal signal for the respective type of solar module can be detected automatically. According to this, a calibration of the electric signal to the type of the solar modules in use takes place. That way, an exchange of the solar modules for a different type can be detected automatically as well.

Alternatively, information about the type of solar modules can be transmitted together with the starting signal for activating the theft recognition and the signal unit can generate a corresponding electric signal on the basis of the type of solar modules and/or the information. Thereby, the electric signal can be generated and sent by the signal unit on the basis of the transmitted information about the type of solar modules.

As an electric signal, a DC voltage signal or AC voltage signal between the connector lines or a high frequency signal between the connector lines or between one of the connector lines and "ground" may be applied.

If the electric signal is sent in preferably periodical intervals of time, the energy consumption can be kept at a very low level, but nevertheless a theft of a solar module can be recognised basically immediately.

Advantageously, a sudden change in the received signal leads to a theft of a solar module being recognised, and an alarm signal is generated.

In the process, the alarm signal can be transmitted to a data communication unit and this data communication unit, for example, can transmit a message to a defined receiver by a defined method of transmission. In particular, a communication system that may be provided within the inverter may be used, which will make it easier to install components of the theft recognition at a later time.

The problem of the invention is also solved by an inverter as mentioned above, wherein the signal unit is designed in such a way that it can generate different electric signals.

Advantages of this and of the dependent claims can be understood from the advantages mentioned above. In the same way, further advantages of the invention can be understood from the following description.

The present invention is described in greater detail by means of the schematic drawings included.

Therein,

As an introduction, it is noted that same parts of the example are indicated by same reference numerals.

FIG. 1 illustrates the design of an inverter 1, more particularly an HF inverter. As the individual components and/or assembly groups and functions of inverters 1 are already known in the prior art, they will not be discussed in detail hereinafter.

Figure 1:
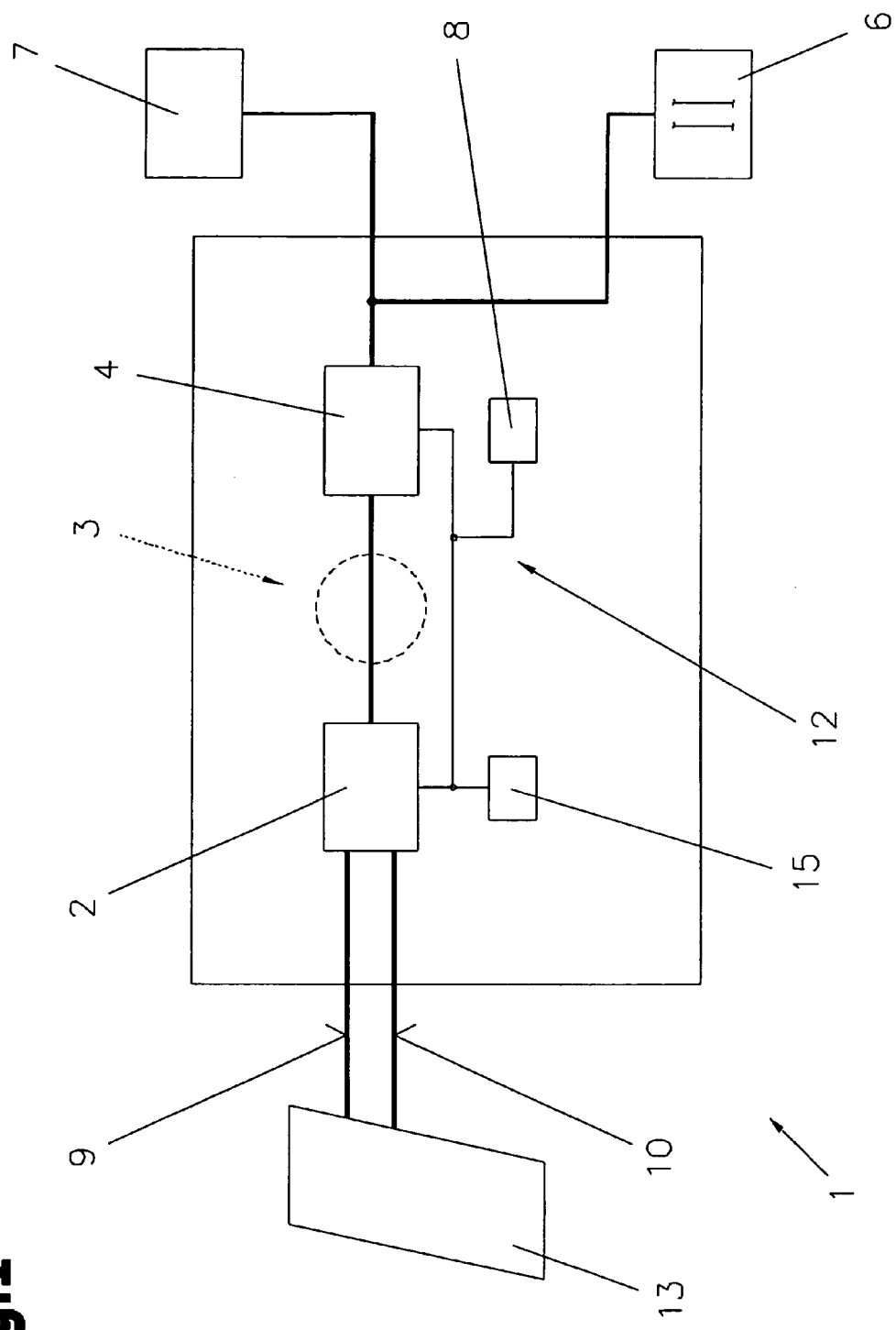
FIG. 1 is a schematic overview of an inverter of a photovoltaic unit.

The inverter 1 includes at least one input DC-DC converter 2, an intermediate circuit 3 and an output DC-AC converter 4. The input DC-DC converter 2 is connected to an energy source 13 and/or an energy generator, which is preferably composed of one or more solar modules 5 that are connected in parallel and/or in series (see FIGS. 2-4). The inverter 1 and the solar modules 5 are referred to as photovoltaic unit and/or PV unit as well. The output of the inverter 1 and/or the output DC-AC converter 4 can be connected to a supply network 6, such as a public or private AC voltage network or a multiple phase network, and/or at least one electric consumer 7, which constitutes a load. A consumer 7 may be, for example, a motor, refrigerator, radio equipment etc. The consumer 7 may also constitute a home power supply system. The individual components of the inverter 1, such as the input DC-DC converter 2 etc., can be connected to a control device 8 by a data bus 12.

Preferably, such an inverter 1 serves as a grid-connected inverter 1, the energy management of which is optimised for feeding the supply network 6 with as much energy as possible. As is known in the prior art, the consumers 7 are fed energy by the supply network 6. Of course, a plurality of inverters 1 that are connected in parallel may be used as well. Thereby, more energy for operating the consumers 7 can be provided.

The control device 8 and/or the controller of the inverter 1 is constituted, for example, by a micro processor, micro controller or computer. The control device 8 can be used for an appropriate control of the individual components of the inverter 1, such as the input DC-DC converter 2 or the output DC-AC converter 4, especially the circuit elements arranged therein. The individual control procedures for this are stored in the control device 8 by corresponding software programmes and/or data or characteristics.

The energy source 13 is connected to the inverter 1 by two connector lines 9, 10 and provides a suitable DC voltage.

According to the invention these two connector lines 9, 10 are used to send an electric signal through the energy source 13 and/or the solar modules 5. As the energy source 13 and/or the solar modules 5, which are connected to the inverter 1, form an electric circuit, the signal sent by the inverter 1 will be received again. Thus, an analysis of the signal sent by the inverter 1 can reveal whether the energy source 13 and/or a solar module 5 has been removed or stolen.

Such a theft recognition is carried out only when the solar modules 5 do not provide a sufficiently high DC voltage for the inverter 1 to correspondingly convert to an AC voltage that the network can use. In this case, the inverter 1 does not feed AC to the supply network 6 any more. Thus, the inverter 1 starts or activates the theft recognition at night and/or at dusk.

The method for the recognition of the theft of a solar module 5 according to the invention, involving the inverter 1 according to the invention, is illustrated in the following FIGS. 2 to 4.

A switchover device 11 according to the invention is provided in the inverter 1 for theft recognition. During normal mode of the inverter 1, when it feeds energy to the supply network 6, the connector lines 9, 10 are connected to the DC-DC converter 2 by the switchover device, as illustrated in FIG. 2. Should the voltage of the solar modules 5 decrease, as this is the case at nightfall, the inverter 1 cannot feed any more energy to the supply network 6. In this case, preferably, the switchover device 11 disconnects the inverter 1 from the solar modules 5 in order to activate the theft recognition according to the invention, as illustrated in FIG. 3. For this, the connector lines 9, 10 are disconnected from the input DC-DC converter 2 of the inverter 1, for example, by two switchover means 16, 17. Hence, the connection between the solar modules 5 and the inverter 1 is interrupted and the input capacitor of the inverter 1, in particular, is disconnected, so it cannot be destroyed by the electric signal for theft recognition. Henceforth, the connector lines 9, 10 for the energy source 13 and/or the solar modules 5 are connected to a signal unit 19 via connection lines 14 by the switchover device 11 and/or the switchover means 16, 17, as illustrated in FIG. 3. Preferably, this interruption is triggered by a starting signal which is, for example, transmitted from the control device 8 of the inverter 1 to a control unit 18 of the switchover device 11 via the data bus 12. Then the control unit 18 will cause the activation of the switchover means 16, 17.

Of course the switchover device 11 may include only one switchover means, in which case only the voltage loss of one switchover means has to be considered. Semiconductors, relays or similar members could, for example, be used as switchover means 16, 17.

Should the connector lines 9, 10 be connected to, for example, two inverters 1 in parallel, both inverters 1 are disconnected from the solar modules 5 by their respective integrated switchover device 11 in order to activate theft recognition. Preferably, the inverters 1 are connected by a data bus 12, so the disconnection of the inverters 1 occurs basically simultaneously. By the same token, information about at which time which inverter 1 sends the electric signal for theft recognition and/or which of the inverters 1 performs this function is exchanged preferably via the data bus 12. This guarantees that only one electric signal for theft recognition is sent at all and, thus, is not subject to interference.

Figure 3:
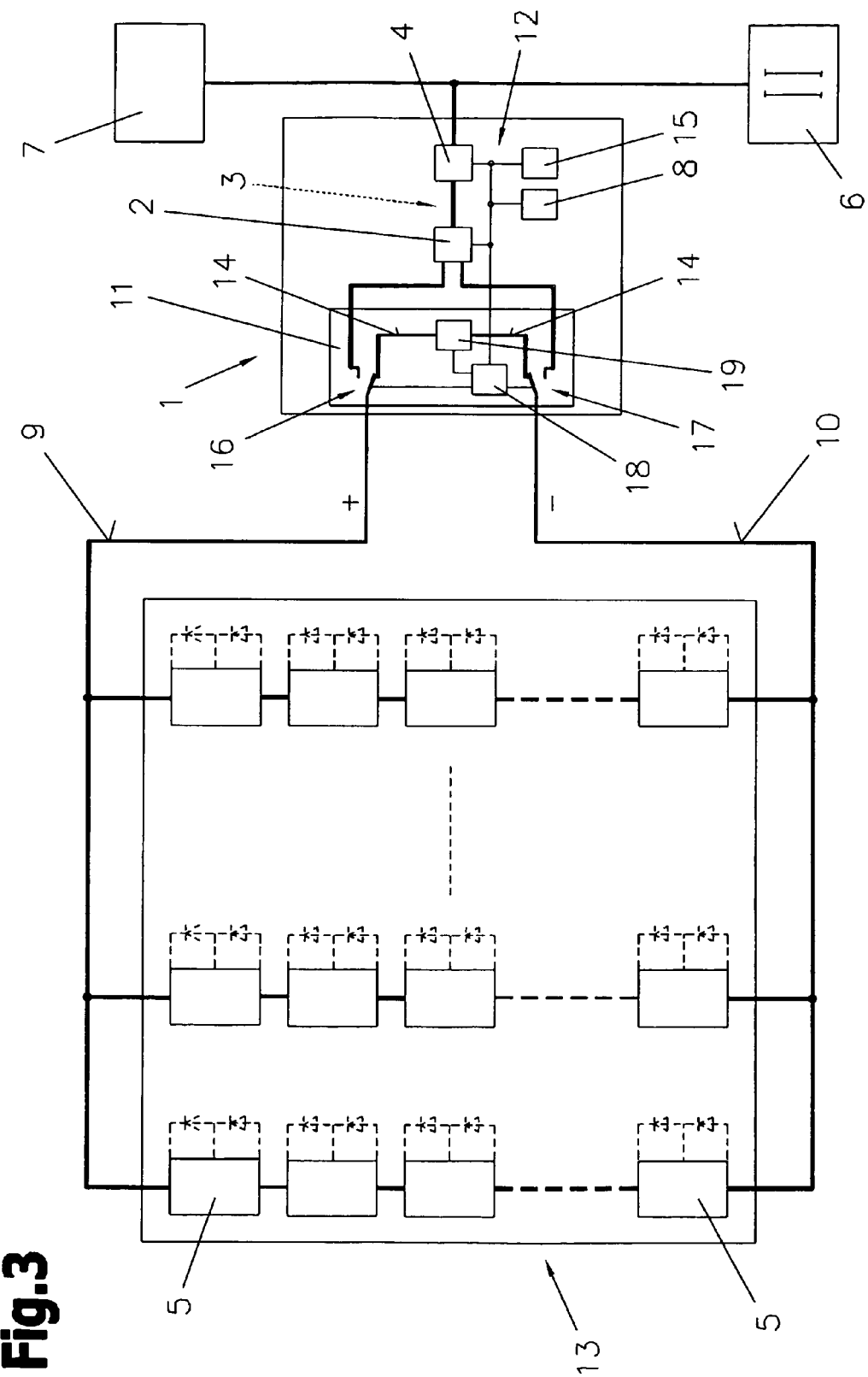
FIG. 3 is a detailed schematic design of a photovoltaic unit with the theft recognition according to the invention in monitoring mode.

According to FIG. 3, the inverter 1 has been disconnected from the solar modules 5, so the method for theft recognition according to the invention can be carried out. For this purpose, an electric signal, which has been generated in the signal unit 19, is sent to the solar modules 5 via the connection lines 14 and the connector lines 9, 10 to verify the presence of all solar modules 5. The signal unit 19 may be integrated in or connected to the control unit 18 of the switchover device 11, and may, for example, be constituted by a signal generator.

Preferably, the signal unit 19 can generate different electric signals, which mainly differ from each other in their signal forms and amplitudes. Consequently, the theft recognition, which is dependent on the signal, is not restricted to certain types of solar modules 5. Corresponding data for different types of solar modules 5 may, for example, be stored in a memory of the control unit 18, so the signal unit 19 can use it to generate a correspondingly suitable electric signal. Now for the signal unit 19 to be able to generate the electric signal adjusted to the solar modules 5 in use, said signal unit 19 has to know the type of the solar modules 5. This can be detected by a number of procedures.

Firstly, the type of the solar modules 5 can be set in the inverter 1 and/or the control device 8, or in the switchover device 11 and/or the control unit 18 when the PV unit is brought into operation. On the basis of this setting, the signal unit 19 generates a corresponding electric signal for carrying out the theft recognition by using the stored data.

In the event that the type of the solar modules 5 has not been set, preferably all signal forms that can be generated from the stored data will be generated and sent through the solar modules 5 via the connector lines 9, 10 one after another. The very signal form that the signal unit 19 receives again correctly and/or analysable will be used for the theft recognition. Applicable criteria for a correctly received signal form are preferably stored in a memory.

Preferably, the signal forms described hereinafter are eventually generated for theft recognition by the signal unit 19, said signal forms being appropriately adjusted to the type of the solar modules 5. The signal form may be formed by a DC voltage signal or an AC voltage signal with different amplitudes. As a signal form for a certain type of solar modules 5, for example, a DC voltage with a constant amplitude may be used. The DC voltage causes a corresponding current to flow through the solar modules 5. This signal form is suitable for solar modules 5 with integrated diodes, which only allow forward current in accordance with the diodes. By measuring and analysing the current that reaches the switchover device 11 and/or the signal unit 19, a theft can be recognised.

An AC voltage signal with a certain frequency (high frequency, in particular) and a constant amplitude may also be used as a signal form. The generated signal is transmitted to the solar module 5 via the connection line 14, the transmission line and the corresponding connector line 9, 10, and received again via the other connector line 10, 9 and the other connection line 14, which serves as a reception line. This signal form is preferably used for solar modules 5 that do not have diodes and thus allow current flow in both directions. The switchover device 11 decides which direction is used as current flow for theft recognition on the basis of the received signal form, so a theft is recognised correctly. Consequently, the current can again flow through the solar modules 5 to be measured and/or analysed by the switchover device 11 and/or the signal unit 19.

Such an AC voltage signal may also be applied between one of the connector lines 9, 10 and "ground". Accordingly, an AC voltage signal with a suitable amplitude, such as 20 volt, is applied to one of the connector lines 9, 10, so part of this AC voltage is applied between an earthed mounting of the solar modules 5 and "ground". The mounting and the solar modules 5 constitute a capacitance, so the part of the AC voltage and/or the current resulting from it is referred to as capacitive current. This capacitive current can be measured between one of the connector lines 9, 10 and "groung" of the switchover device 11, requiring the switchover device 11 to be earthed. Any change in this capacitive current might indicate a theft.

As the form of the signal received is changed by the capacitance, a theft of the solar modules 5 can also be detected in a difference between the received signal and the sent signal. In this case, the AC voltage signal is applied between the connector lines 9, 10.

In the case of solar modules 5 that are arranged in parallel or in series, the electric signal will divide itself substantially evenly between the strings connected in parallel. The switchover device 11 and/or the signal unit 19 receive the total of all strings' currents.

After the signal form for the theft recognition has been defined corresponding to the type of the solar modules 5, this signal form and the form of the signal that is normally (i. e. when all solar modules are present) received are being stored and a kind of calibration is carried out. The signal forms stored will serve as reference values and/or values for comparisons for at least the following night, so if the form of the received signals should deviate from the reference value, a theft is reliably detected.

A change and/or deviation of the received signal form from the sent signal form is mainly detected by recognising a change in the current through the solar modules 5, as its resistance changes because of missing solar modules 5. The change that occurs is substantially sudden, as theft of one or more solar modules 5 from the circuit causes the resistance to undergo a substantially sudden change as well.

Figure 4:
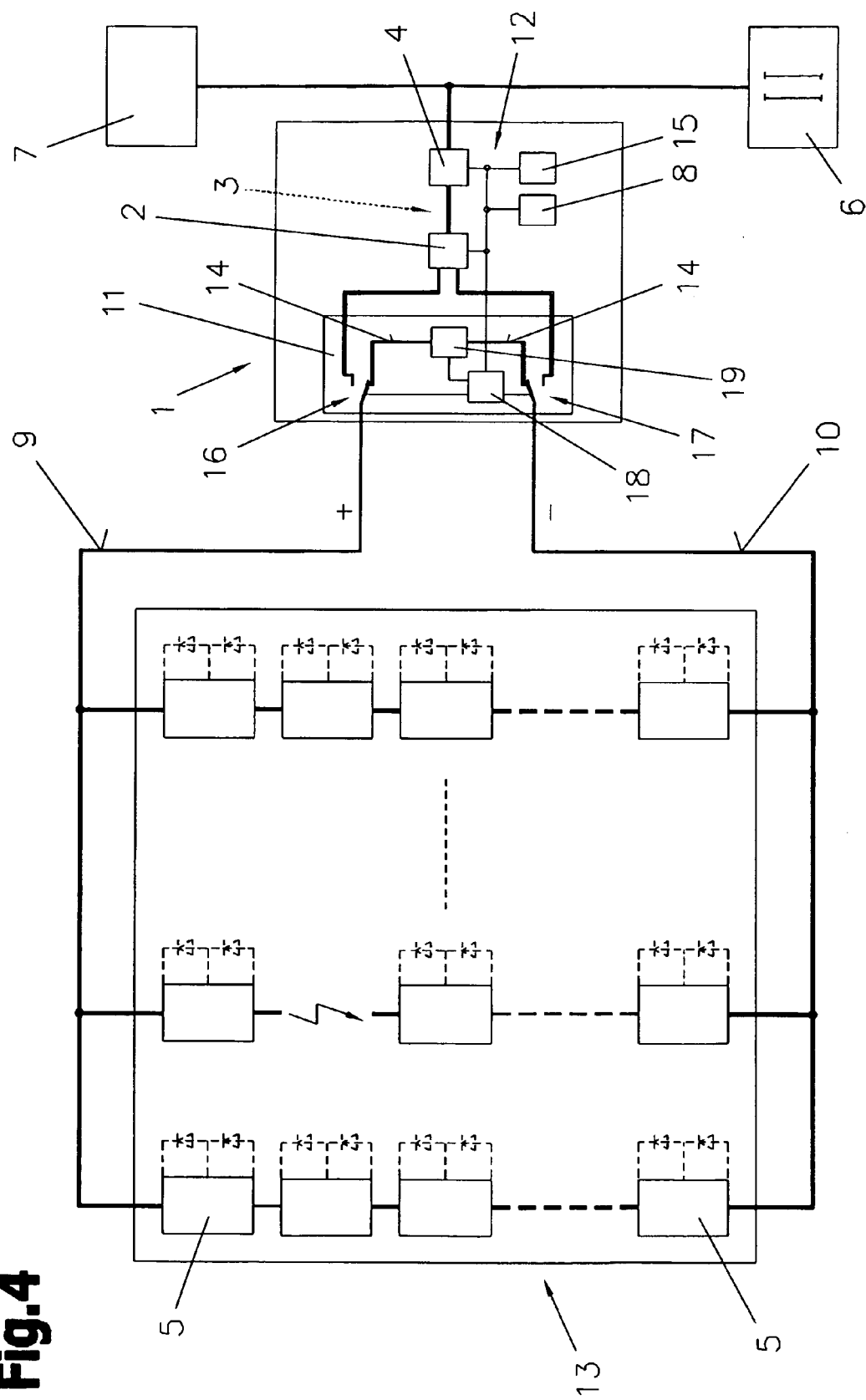
FIG. 4 is a detailed schematic design of a photovoltaic unit with the theft recognition according to the invention in monitoring mode during a theft of a solar module.

This case is illustrated by a lightning symbol in FIG. 4. Thereby, the current caused by the electric signal will change accordingly, which makes it possible to draw conclusions about the theft of one or more solar modules 5 on the basis of a change in the current. Detecting a sudden change of the received electric signal for the detection of the theft of at least one solar module 5 is of particular importance when using the variant described above, according to which the capacitive current is measured. This is because other influential factors such as a change in humidity, temperature or the like cannot cause a sudden change in the capacitive current. On the contrary, a sudden change in the current measured can reliably be interpreted as being caused by the removal of a solar module 5. In general, more than one solar module 5 are removed at the same time, as preferably a number of solar modules 5 are connected in series to form what is known as a string. Now, if at least one solar module 5 of a string is removed, this will lead to a change in the resistance of the entire energy source 13 due to removing the resistance of one string.

When detecting a theft by the switchover device 11 and/or the signal unit 19, an alarm signal, which can be transmitted to a data communication unit 15 of the inverter 1 via the data bus 12, can be generated. The data communication unit 15 can produce an alarm message, which is communicated to defined persons and/or institutions by telephone, fax, e-mail or the like, or it can activate a warning light, signal horn or the like in the vicinity of the PV unit and/or a control centre. That way, a theft can be detected early and, as the case may be, prevented.

Figure 2:
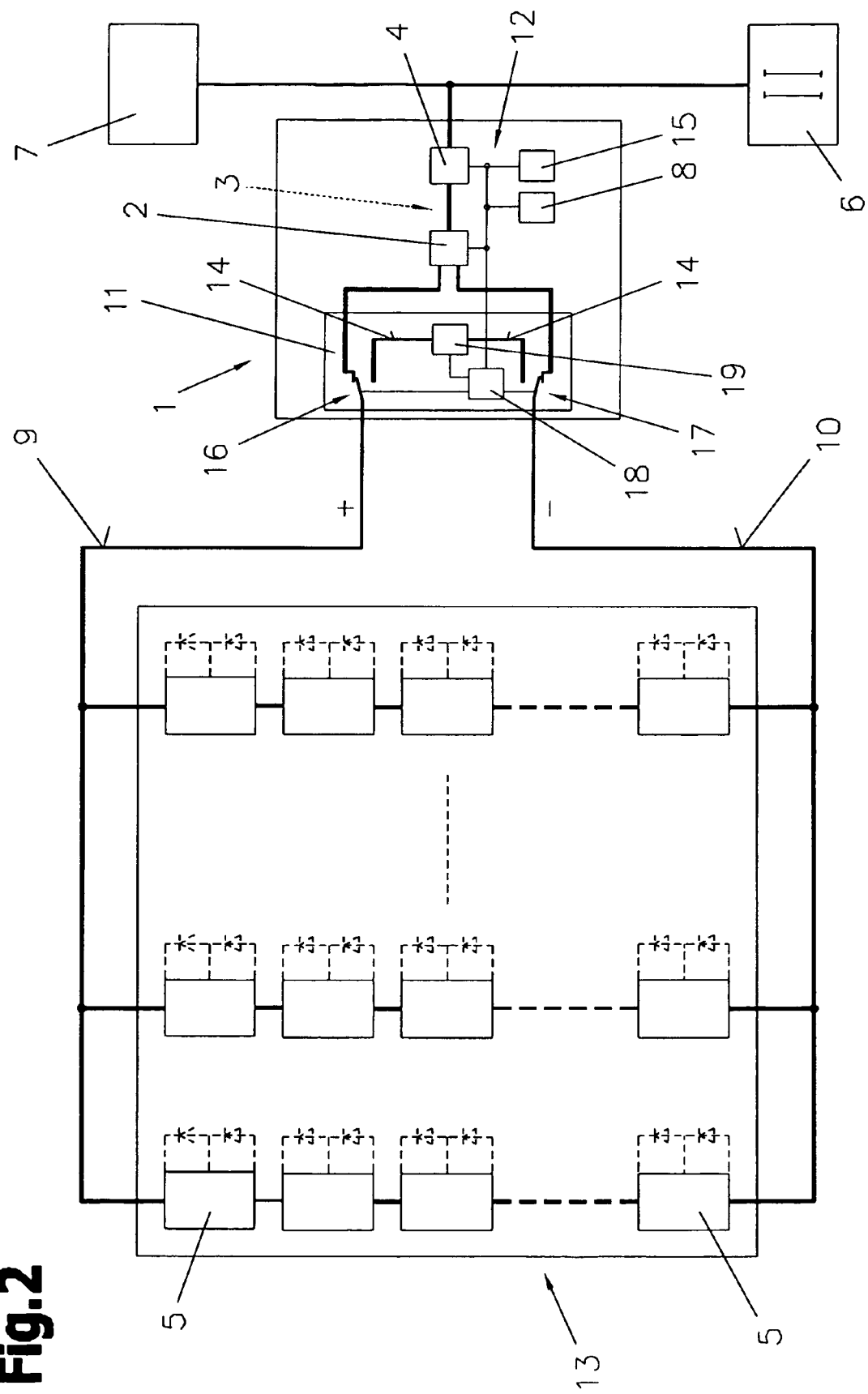
FIG. 2 is a detailed schematic design of a photovoltaic unit with the theft recognition according to the invention in normal operation mode.

If, especially during the night, no theft of solar modules 5 is detected, the inverter 1 can be switched back to normal mode according to FIG. 2. This switching is again done by the switchover device 11, which monitors the voltage transferred by the solar modules 5. Once this voltage exceeds a defined and/or adjustable threshold value, the switchover means 16, 17 are being switched over, so the connector lines 9, 10 are being connected to the input DC-DC converter 2. At the same time, a corresponding signal is transmitted from the control unit 18 of the switchover device 11 to the control device 8 of the inverter 1 via the data bus 12, so preferably the relevant hardware and software components can be activated. The inverter 1 can thus return to feeding energy to the supply network 6 and/or supplying the consumers 7 with energy.

During the theft recognition, the inverter 1 receives electric energy from the supply network 6 or an energy storage. In order not to exert substantial influence on the effectiveness of the inverter 1 by the energy required for this, the electric signal can be sent in periodical intervals of time such as every second, every ten seconds or the like. Such an energy-saving measure will make it possible to maintain a substantially permanent theft recognition nevertheless.

It should also be noted that the theft recognition according to the invention is not dependent on the type of the inverter 1. Instead of the HF inverter 1 used in the example, an inverter 1 with a 50 Hz transformer, a transformerless inverter 1 or a stand-alone inverter may be equipped with the device for recognising the theft of the energy source 13 and/or a solar module 5.

Even though the description above focuses mainly on solar modules 5 as energy sources 13, the present invention may be applied to other energy sources 13 as well.

The invention claimed is:

1. A method for theft recognition of at least one solar module (5) on a photovoltaic unit, said solar modules (5) being connected in normal mode via connector lines (9, 10) to at least one inverter (1), with the voltage of the solar modules (5) being monitored, and in a monitoring mode, when a defined voltage of the solar modules (5) is measured, an electric signal is generated and applied to at least one of the connector lines (9, 10) of the solar modules (5), and the signal received by the at least one solar module (5) is measured and analyzed to assess a theft, wherein in monitoring mode a signal unit (19) integrated in an inverter (1) is activated by a control device (8) of the inverter (1), and wherein electric signals differing in form and amplitude are sent by the signal unit (19) in succession to the at least one solar module (5), with that electric signal, which causes a useful received signal when the solar modules (5) are present, depending on the respective type of solar module (5), being selected as a reference signal for assessing a theft.

2. The method according to claim 1, wherein in monitoring mode the solar modules (5) are being disconnected from the at least one inverter (1) by a switchover device (11).

3. The method according to claim 2, wherein the electric signal is generated by a signal unit (19) integrated in the switchover device (11).

4. The method according to claim 3, wherein for activating the switchover device (11) a starting signal is transmitted from the control device (8) to the switchover device (11).

5. The method according to claim 4, wherein the connection of at least one connector line (9, 10) to the at least one inverter (1) is interrupted by at least one switchover means (16, 17) and at least one of the connector lines (9, 10) is being connected to the signal unit (19) by at least one switchover means (16, 17) when the switchover device (11) is being activated.

6. The method according to claim 3, wherein the form and amplitude of the electric signal are generated by the signal unit (19) depending on the type of the solar module (5).

7. The method according to claim 6, wherein together with the starting signal information about the type of the solar modules (5) is transmitted and wherein depending on the type of the solar modules (5) a corresponding electric signal is being generated by the signal unit (19).

8. The method according to claim 1, wherein as an electric signal a DC voltage signal or AC voltage signal is being applied between the connector lines (9, 10).

9. The method according to claim 1, wherein as an electric signal an HF signal is being applied between the connector lines (9, 10) or between one of the connector lines (9, 10) and earth.

10. The method according to claim 1, wherein the electric signal is sent in preferably periodical intervals of time.

11. The method according to claim 1, wherein a theft is detected because of a sudden change in the received signal and an alarm signal is generated.

12. The method according to claim 11, wherein the alarm signal is transmitted to a data communication unit (15).

13. The method according to claim 12, wherein via the data communication unit (15) a message is transmitted to a defined receiver by a defined method of transmission.

14. An inverter (1) with an intermediate circuit (3), a DC-AC converter (4), at least one solar module (5) connected via connector lines (9, 10) in normal mode, and with a control device (8), a control unit (18) for measuring the voltage of the solar modules (5), providing a signal unit (19) which can be connected to the connector lines (9, 10) for generating and transmitting an electric signal in a monitoring mode, and a device for measuring and analyzing the signal received by the at least one solar module (5), so conclusions can be drawn about the theft of a solar module (5) from the received signal, wherein the signal unit (19) is integrated in the inverter (1) and connected to the control device (8) of the inverter (1) and designed to generate electric signals that differ in form and amplitude, so that electric signal, which causes a useful received signal when the solar modules (5) are present, depending on the respective type of solar module (5), can be selected as a reference signal for assessing a theft in monitoring mode.

15. The inverter (1) according to claim 14, wherein a switchover device (11) for disconnecting the solar modules (5) from the DC-DC converter (2) and for connecting the solar modules (5) to the signal unit (19) is provided.

16. The inverter (1) according to claim 15, wherein a control unit (18) for activating the switchover device (11) and the signal unit (19) is provided.

17. The inverter (1) according to claim 15, wherein at least one switchover means (16, 17) is arranged within the switchover device (11).

18. The inverter (1) according to claim 17, wherein at least one of the switchover means (16, 17) is designed for connecting at least one of the connector lines (9, 10) to the signal unit (19) when the switchover device (11) is activated in monitoring mode and for connecting at least one of the connector lines (9, 10) to the inverter (1) when the switchover device (11) is deactivated in normal mode.

19. The inverter (1) according to claim 16, wherein the control unit (18) is connected to the control device (8) via a data bus (12).

20. The inverter (1) according to claim 19, wherein a data communication unit (15), which is connected to the data bus (12), is provided for transmitting a message depending on a detected theft of a solar module (5).

* * * * *